United States Patent
Hagenauer et al.

(10) Patent No.: US 12,463,418 B2
(45) Date of Patent: Nov. 4, 2025

(54) ELECTRONIC CIRCUIT FOR THE SWITCHING-OFF OF SEMICONDUCTOR SWITCHES IN THE EVENT OF CRITICAL CURRENTS

(71) Applicant: Lisa Dräxlmaier GmbH, Vilsbiburg (DE)

(72) Inventors: Stefan Hagenauer, Essenbach (DE); Stefan Hofinger, Sankt Wolfgang (DE)

(73) Assignee: Lisa Dräxlmaier GmbH, Vilsbiburg (DE)

( * ) Notice: Subject to any disclaimer, the term of this patent is extended or adjusted under 35 U.S.C. 154(b) by 137 days.

(21) Appl. No.: 18/589,808

(22) Filed: Feb. 28, 2024

(65) Prior Publication Data
US 2024/0297498 A1    Sep. 5, 2024

(30) Foreign Application Priority Data
Mar. 1, 2023 (DE) .......................... 102023105115.6

(51) Int. Cl.
*H02H 9/02* (2006.01)
*B60L 3/00* (2019.01)
*H02H 1/00* (2006.01)

(52) U.S. Cl.
CPC ............ *H02H 9/025* (2013.01); *B60L 3/0084* (2013.01); *H02H 1/0007* (2013.01)

(58) Field of Classification Search
CPC ...... H02H 9/025; H02H 1/0007; H02H 3/021; H02H 3/05; H02H 3/087; B60L 3/0084;
(Continued)

(56) References Cited

U.S. PATENT DOCUMENTS

| | | | | |
|---|---|---|---|---|
| 4,914,542 A | * | 4/1990 | Wagoner ................. | H03K 17/12 361/18 |
| 5,008,586 A | * | 4/1991 | Miyazaki ................. | H03F 1/523 361/93.1 |

(Continued)

FOREIGN PATENT DOCUMENTS

| | | | | |
|---|---|---|---|---|
| CN | 107612293 A | * | 1/2018 | ........... H03K 17/162 |
| CN | 113991812 A | * | 1/2022 | .......... H02J 7/00712 |

(Continued)

OTHER PUBLICATIONS

Cao et al., Design of RCD Snubber Considering Asymmetric Absorption Position of Multiple Switches in Parallel for LLC Application, 2022 IEEE International Power Electronics and Application Conference and Exposition (PEAC), 6 pgs, IEEE Xplore.

*Primary Examiner* — Dharti H Patel
(74) *Attorney, Agent, or Firm* — Burris Law, PLLC

(57) ABSTRACT

An electronic circuit for a battery-electric vehicle for the switching-off of semiconductor switches in the event of critical currents, the electronic circuit includes at least two semiconductor switches that are connectable in parallel with one another between an energy supply source and a load. The electronic circuit includes a control unit configured to detect a current flowing through the at least two semiconductor switches, and, based on reaching a critical current, to switch off the at least two semiconductor switches. The electronic circuit includes a delay circuit connected in parallel with the at least two semiconductor switches and is configured, in the event of a not-exactly-simultaneous switching-off of the at least two semiconductor switches, to absorb a part of the critical current that switches over from at least one first-switching-off semiconductor switch to another one of the at least two semiconductor switches.

13 Claims, 3 Drawing Sheets

(58) Field of Classification Search
CPC ............ B60L 3/0046; H03K 17/08104; H03K 17/6871
USPC ........................................................ 361/93.9
See application file for complete search history.

(56) References Cited

U.S. PATENT DOCUMENTS

| | | | | |
|---|---|---|---|---|
| 5,519,264 | A * | 5/1996 | Heyden | H02H 9/001 361/57 |
| 5,953,198 | A * | 9/1999 | Murata | H01H 47/002 361/160 |
| 5,999,041 | A * | 12/1999 | Nagata | H03K 17/0822 327/108 |
| 11,503,689 | B1 * | 11/2022 | Lee | H05B 45/50 |
| 11,646,575 | B2 * | 5/2023 | Li | H02H 9/04 361/2 |
| 12,278,483 | B2 * | 4/2025 | Sim | H02H 3/027 |
| 2012/0098577 | A1 | 4/2012 | Lobsiger et al. | |
| 2012/0176713 | A1 * | 7/2012 | Cheng | H02H 9/025 361/79 |
| 2012/0287545 | A1 * | 11/2012 | Tran | H02M 1/38 361/101 |
| 2015/0016005 | A1 * | 1/2015 | Simonson | H02H 9/004 361/93.9 |
| 2015/0280566 | A1 * | 10/2015 | Chang | H05B 45/3725 323/282 |
| 2016/0268894 | A1 * | 9/2016 | Hayashi | H03K 17/0822 |
| 2018/0062634 | A1 * | 3/2018 | Shin | H03K 17/90 |
| 2020/0328690 | A1 * | 10/2020 | Venkataramanan | H02M 1/32 |
| 2022/0006453 | A1 * | 1/2022 | Immel | H03K 17/162 |

FOREIGN PATENT DOCUMENTS

| | | | | |
|---|---|---|---|---|
| DE | 112022004044 | T5 * | 8/2024 | ............ H10D 30/60 |
| JP | H10247843 | A * | 9/1998 | |

* cited by examiner

ELECTRONIC CIRCUIT FOR THE SWITCHING-OFF OF SEMICONDUCTOR SWITCHES IN THE EVENT OF CRITICAL CURRENTS

CROSS-REFERENCE TO RELATED APPLICATION

This application claims priority to and the benefit of DE 10 2023 105 115.6 filed on Mar. 1, 2023. The disclosure of this application is incorporated herein by reference.

FIELD

The present disclosure relates to the field of semiconductor switches and reduction of circuit energy in semiconductor switches in automotive applications. In particular, the present disclosure relates to an electronic circuit for a battery-electric vehicle for the switching-off of semiconductor switches in the event of critical currents.

BACKGROUND

The statements in this section merely provide background information related to the present disclosure and may not constitute prior art.

With the switching-off of semiconductor circuits connected in parallel, such as, for example, MOSFETs, in the event of a critical current, for example, a short-circuit current, a highly dynamic switching-off process arises. As a result, in certain instances, some of the semiconductors can switch off more rapidly than others, and the critical current may be carried by a few or even a single MOSFET. The semiconductor switch that carries the short-circuit current may be adversely impacted before the complete switching-off has occurred. In this case, the energy reduction may be provided by a suppressor circuit. The semiconductors switch off, and the stored circuit energy is reduced in the suppressor circuit. The critical current is absorbed by the suppressor circuit and may no longer be carried by the semiconductor switches. However, such a suppressor circuit may be expensive to provide to reduce the occurring short-circuit energy. The suppressor circuit uses a variety of electronic components, and thus occupies significant space in the vehicle and also has a high weight. Alternatively, mechanical safeguards may be used which can only carry out a small number of separation operations before they must be exchanged.

SUMMARY

This section provides a general summary of the disclosure and is not a comprehensive disclosure of its full scope or all of its features.

The present disclosure provides a concept for an efficient switching-off of semiconductor switches in the event of critical currents in a battery-electric vehicle, in which the above-described disadvantages do not occur.

The present disclosure is based on interconnecting a delay circuit in parallel with the semiconductor switches. This takes place over the first very short time period of the critical current during the switching-off of the semiconductor switch, so that none of the semiconductor switches connected in parallel carry a critical current. After the switching-off of the semiconductor switch, the stored circuit energy can be reduced through all switched-off semiconductors. For this purpose, the semiconductor switches must be robust enough to be able to reduce the circuit energy.

Thus, a simultaneous switching-off of the semiconductor switches can be provided with the aid of the delay circuit, and the circuit energy can be reduced in the switched-off semiconductors without impacting the semiconductor switches.

Technical advantages of the present disclosure include the cost reduction, the weight reduction, and the installation space improvement with use of the concept presented here. Instead of a massive suppressor circuit, a much smaller delay circuit can be used. The parallel circuit of semiconductors that can be switched off simultaneously in a first state is thereby made possible for the first time, and the highly dynamic switching-off process is thus manageable. The advantages of robust, avalanche-proof semiconductors, such as, for example, semiconductors made of silicon carbide (SiC), can thus be used efficiently for the reduction of circuit energies.

According to one aspect, the present disclosure provides an electronic circuit for a battery-electric vehicle for the switching-off of semiconductor switches in the event of critical voltages, in which the electronic circuit comprises: at least two semiconductor switches that are switchable in parallel with one another between an energy supply source and a load; a control unit that is configured to detect a current flowing through the at least two semiconductors, and upon the reaching of a critical current, to switch off the at least two semiconductor switches, and a delay circuit, which is switched in parallel with the at least two semiconductor switches, and is configured to absorb, during a not-exactly-simultaneous switching-off of the at least two semiconductor switches, a part of the critical current that switches over from at least one first-switching-off semiconductor switch onto the others of the at least two semiconductor switches.

With such an electronic circuit, the highly dynamic switching-off process in the event of critical currents, such as a short circuit or overcurrent, is provided for the first time without an expensive and massive suppressor circuit being used for this purpose. The electronic circuit uses a delay circuit that can be constructed much smaller. With this electronic circuit, the parallel circuit of semiconductors that must be switched off simultaneously in a first state is made possible for the first time, and the highly dynamic switching-off process is thus manageable without impacting the semiconductor switches.

The critical current is a threshold current value that occurs in the case of a short circuit or in the case of an overcurrent. If the detected current in the total path between the energy supply source and the load exceeds this threshold current value, then the critical current is reached and the control unit switches off the at least two semiconductor switches.

The delay circuit is constructed such that it takes over the first short time period of the critical current during the switching-off of the semiconductor switches, thus the name "delay circuit," so that none of the semiconductor switches connected in parallel carry a critical current. After the switching-off of the semiconductor switches, the stored circuit energy can be reduced through all switched-off semiconductors. The semiconductor switches usually do not switch off simultaneously, even when they are simultaneously controlled. The time that passes between the switching-off of the first semiconductor switch and the switching-off of the last semiconductor switch is compensated for by the delay circuit, by the delay circuit taking over a part of the critical current, or of the energy of this current, that is commuted from the switched-off semiconductor switches to the not-yet-switched-off semiconductor switch.

According to one exemplary form of the electronic circuit, the not-first-switching-off semiconductor switches are configured to absorb the remaining part of the critical current that is not absorbed by the delay circuit.

This results in that the entire energy of the critical current in the electronic circuit is reduced, that is, in the semiconductor switches connected in parallel and the delay circuit connected in parallel therewith. The semiconductor switches are configured correspondingly robust so that they can carry a part of the critical current. Depending on how many semiconductor switches are connected in parallel, the current-carrying capacity of the entire electronic circuit increases.

According to one form of the electronic circuit, the delay circuit is configured to absorb the part of the critical current at least until a last-switching-off semiconductor switch of the at least two semiconductor switches is switched off.

This results in that the time that passes between the switching-off of the first semiconductor switch and the switching-off of the second semiconductor switch is bridged by the delay circuit, by the delay circuit assuming a part of the critical current that is commuted from the switched-off semiconductor switches to the not-yet-switched-off semiconductor switch, so that none of the semiconductor switches connected in parallel carry a current that is critical for them. After the switching-off of the semiconductor switches, the stored circuit energy can be reduced by all switched-off semiconductors.

According to one exemplary form of the electronic circuit, the electronic circuit is configured to divide, from a switching-off of the at least one first switching-off semiconductor switch to a switching-off of a last switching-off semiconductor switch, the critical current between the not-yet-switched-off semiconductor switches and the delay circuit.

This results in that no semiconductor switch carries the critical current alone, but rather this critical current is divided between the parallel-connected not-yet-switched-off semiconductor switches and the delay circuit.

According to one form of the electronic circuit, the delay circuit includes an energy storage for the receiving of an energy of the part of the critical current.

This brings the technical advantage that the part of the critical current during the switching-off of the semiconductor switches can be received by the energy storage of the delay circuit, and the semiconductor circuit is correspondingly unloaded.

According to one form of the electronic circuit, the delay circuit comprises a resistor-capacitor (RC) snubber circuit or a resistor-capacitor-diode (RCD) snubber circuit.

Here a RC snubber circuit is a series circuit or a parallel circuit of a capacitor with a resistor. In a RCD snubber circuit a diode is also interconnected. These components are dimensioned suitably for the voltage and the current. The diode can be connected in series or in parallel. The diode can, for example, be connected in parallel with the resistor, and the capacitor can be connected in series with the diode/resistor parallel path. A second resistor can also be present in series with the diode. The second resister can then be connected in parallel with this "diode+resistor" circuit. For example, the capacitor can then be connected in series with these three components. The snubber circuit can be installed in parallel with the semiconductor switches.

Such an RC or RCD snubber circuit offers the following technical advantages. The voltage peaks are intercepted by the snubber circuit and damped, because the current-change speed is reduced. The critical current first flows at the original level into the capacitor, and then drops with increasing charge of the capacitor in accordance with the decreasing magnetic energy. Electrical energy that would otherwise lead to a resonance oscillation is simultaneously converted into heat by the current flow in the resistor. The voltage-increase speed at the semiconductor switches is thereby limited to a value that is not critical for them. With MOSFETs, it can be inhibited with this snubber circuit that the Miller capacitance leads to unsound switching-off behavior in the event of a too-rapid voltage increase.

According to one form of the electronic circuit, the control unit includes a driver circuit that is configured to control, upon reaching of the critical current, the at least two semiconductor switches via a respective driver signal for the switching-off; in which the controlling is configured to transmit, upon reaching of the critical current, the respective driver signal simultaneously to the at least two semiconductor switches.

This results in that via the driver circuit the semiconductor switches are simultaneously controlled for the switching-off. Even when, with simultaneous controlling by the respective driver signals, no simultaneous switching-off of the semiconductor switch occurs, however, the time between the switching-off of the first semiconductor switch and the switching-off of the last semiconductor switch can thereby be kept very short, for example, in the micro-to nano-second range, so that a part of the critical current may only be absorbed by the delay circuit for a very short time, and thereafter can be reduced via the semiconductor switches.

According to one form of the electronic circuit, the at least two semiconductor switches are configured as SiC MOSFETs or as Si MOSFETs.

The advantages of robust, avalanche-proof semiconductors, such as, for example, semiconductors made of silicon carbide (SiC) can thus be used efficiently for the reducing of circuit energies. In a parallel circuit of such SiC MOSFETs, each SiC MOSFET can thus absorb a part of the critical current without it being damaged or destroyed. MOSFETs connected in parallel increase the current-carrying capacity of the circuit. With separation of critical currents, MOSFETs connected in parallel partially increase the reducible energy in the MOSFETs, since the energy to be reduced is distributed nonuniformly over all MOSFETs. The strength of the distribution depends on the manufacturing deviations of the MOSFETs.

According to one form of the electronic circuit, the control unit includes a detection circuit that is configured to detect an overcurrent and/or a short-circuit current.

This offers the technical advantage that with such a detection circuit, critical currents can be efficiently and rapidly determined, so that a rapid switching-off of the semiconductor switches is possible so that they are efficiently protected from critical currents in the event of short circuit and overcurrent, and their service life can thus be extended.

According to one form of the electronic circuit, the electronic circuit is configured to reduce the critical current, without an additional suppressor circuit, solely by the at least two semiconductor switches and the delay circuit.

This results in that without such a suppressor circuit, the circuit complexity can be reduced, which saves weight, and allows the limited installation space in the electric vehicle to be used efficiently. Instead of a massive suppressor circuit, a much smaller delay circuit can be used.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The Figures are merely schematic representations and serve only for the explaining of the present disclosure. Identical or functionally identical elements are provided with the same reference numbers throughout.

Figure 1:
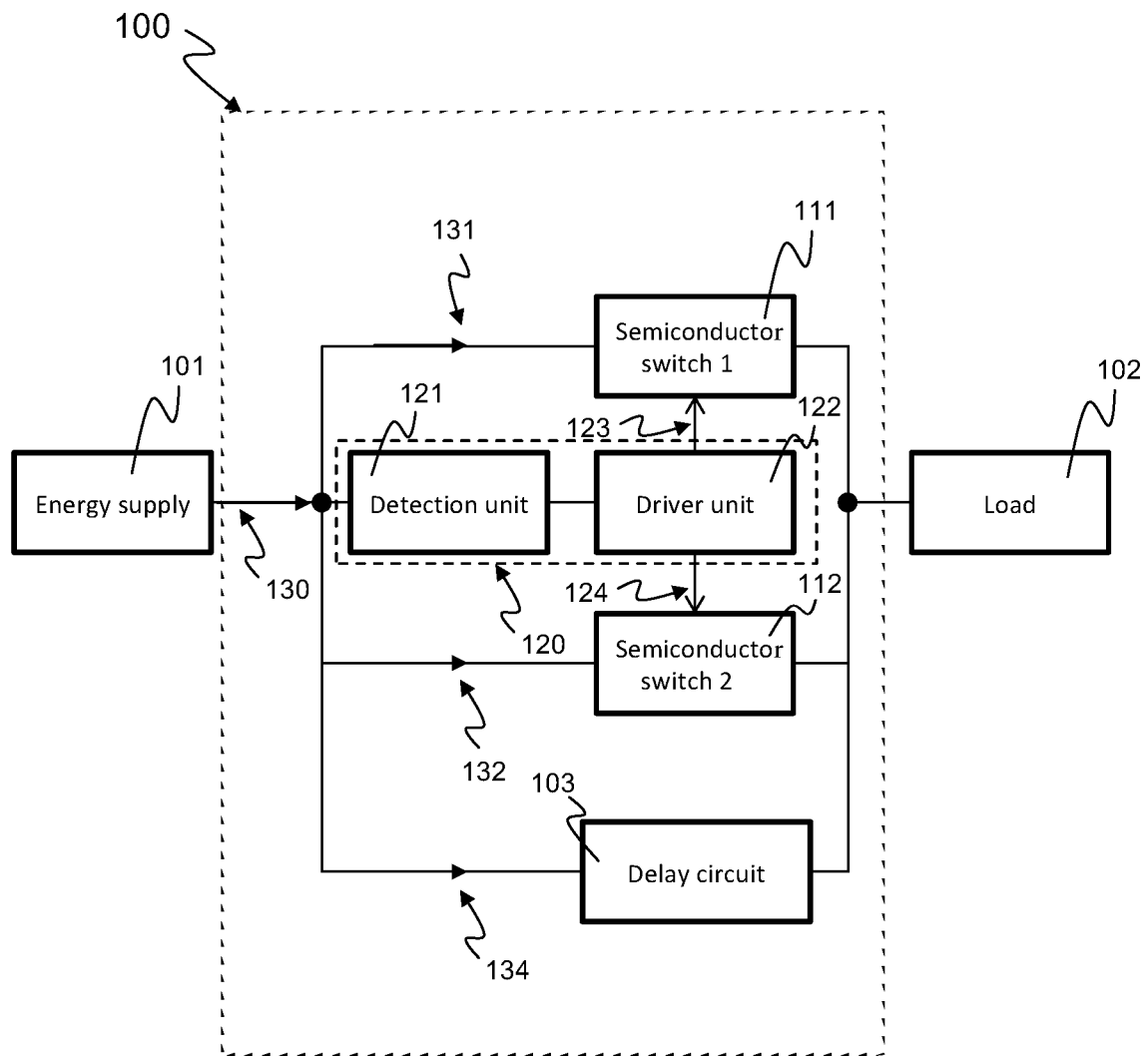
FIG. 1 shows a block diagram of an electronic circuit according to a first form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The aspects and forms are described with reference to the drawings, in which identical reference numbers generally refer to identical elements. In the following description, for the purpose of explanation numerous specific details are presented in order to convey a detailed understanding of one or more aspects of the present disclosure. However, for a person skilled in the art it can be obvious that one or more aspects or forms can be embodied with a lesser degree of the specific details. In other cases, known structures and elements are depicted in schematic form in order to facilitate the describing of one or more aspects or forms. It is understood that other forms can be used, and structural or logical changes can be undertaken, without deviating from the concept of the present disclosure.

FIG. 1 shows a block circuit diagram of an electronic circuit 100 according to an exemplary first form.

The electronic circuit 100 is for a battery-electric vehicle for the switching-off of semiconductor switches in the event of critical currents, such as, for example, short-circuit currents or overcurrents in the event of overload.

The electronic circuit 100 comprises at least two semiconductor switches 111, 112 that are switchable, in parallel with one another, between an energy supply source 101 and a load 102. In FIG. 1, two semiconductor switches 111, 112 are shown by way of example that are switched between the energy supply source 101 and the load 102.

The electronic circuit 100 further comprises a control unit 120 and a delay circuit 103.

The control unit 120 is configured to detect a current flowing through the at least two semiconductor switches 111, 112, and, upon reaching this current, to switch off a critical current of the at least two semiconductor switches 111, 112.

The delay circuit 103 is connected in parallel with the two semiconductor switches 111, 113, and configured to absorb, in the event of a not-exactly-simultaneous switching-off of the two semiconductor switches 111, 112, a part of the critical current that switches over from a first switching-off semiconductor switch, for example, the switch 111, to the other semiconductor switches, for example, the switch 112.

The energy supply 101 can be a battery, for example, a high-voltage battery in a battery-electric vehicle. The load 102 can be an electrical component in the vehicle that is supplied with current from the battery. The semiconductor switches 111, 112 serve to separate, in the event of the occurrence of a short circuit, the electrical line between HV battery and electronic components in order to inhibit damage to the components.

Alternatively, the energy supply 101 can also be a charging column, and the load 102 can be a battery, for example, a HV battery of the battery-electric vehicle. In this case the semiconductor switches 111, 112 serve to protect the charging process of the battery, and to separate, in the event of the occurrence of a short circuit in the charging path, the battery from the charging column, in order to inhibit damage to the battery and the charging column.

The not-first-switched-off semiconductor switch 112 can be configured here to absorb the remaining part of the critical current that is not absorbed by the delay circuit 103.

The delay circuit 103 can be configured to absorb the part of the critical current until the last-switching-off semiconductor switch 112 is switched off.

The electronic circuit 100 can be configured to divide, from a switching-off of the first-switching-off semiconductor switch 111 to a switching-off of the last-switching-off semiconductor switch 112, the critical current between the not-yet-switched-off semiconductor switch 112 and the delay circuit 103.

The delay circuit 103 can include an energy storage, for example, a capacitor, for the absorption of energy of the part of the critical current.

This delay circuit 103 offers the following technical advantages. During separation of critical currents, for example, in the event of a short circuit or overcurrent, without a capacitor, steep voltage peaks arise. These voltage peaks are intercepted by the delay circuit 103 and damped, because the current-change speed is reduced. The critical current first flows at the original level into the energy storage or capacitor, and then drops with increasing load of the energy storage or capacitor in accordance with the decreasing magnetic energy. The voltage-increase speed at the semiconductor switches 111, 112 is thereby limited to a value that is not critical for them. With MOSFETs as semiconductor switches 111, 112, with this delay circuit 103 it can be inhibited that the Miller capacitance leads to unsound switching-off behavior in the event of a too-rapid voltage increase.

For example, the delay circuit 103 can be embodied as an RC snubber circuit or an RCD snubber circuit.

Figure 2:
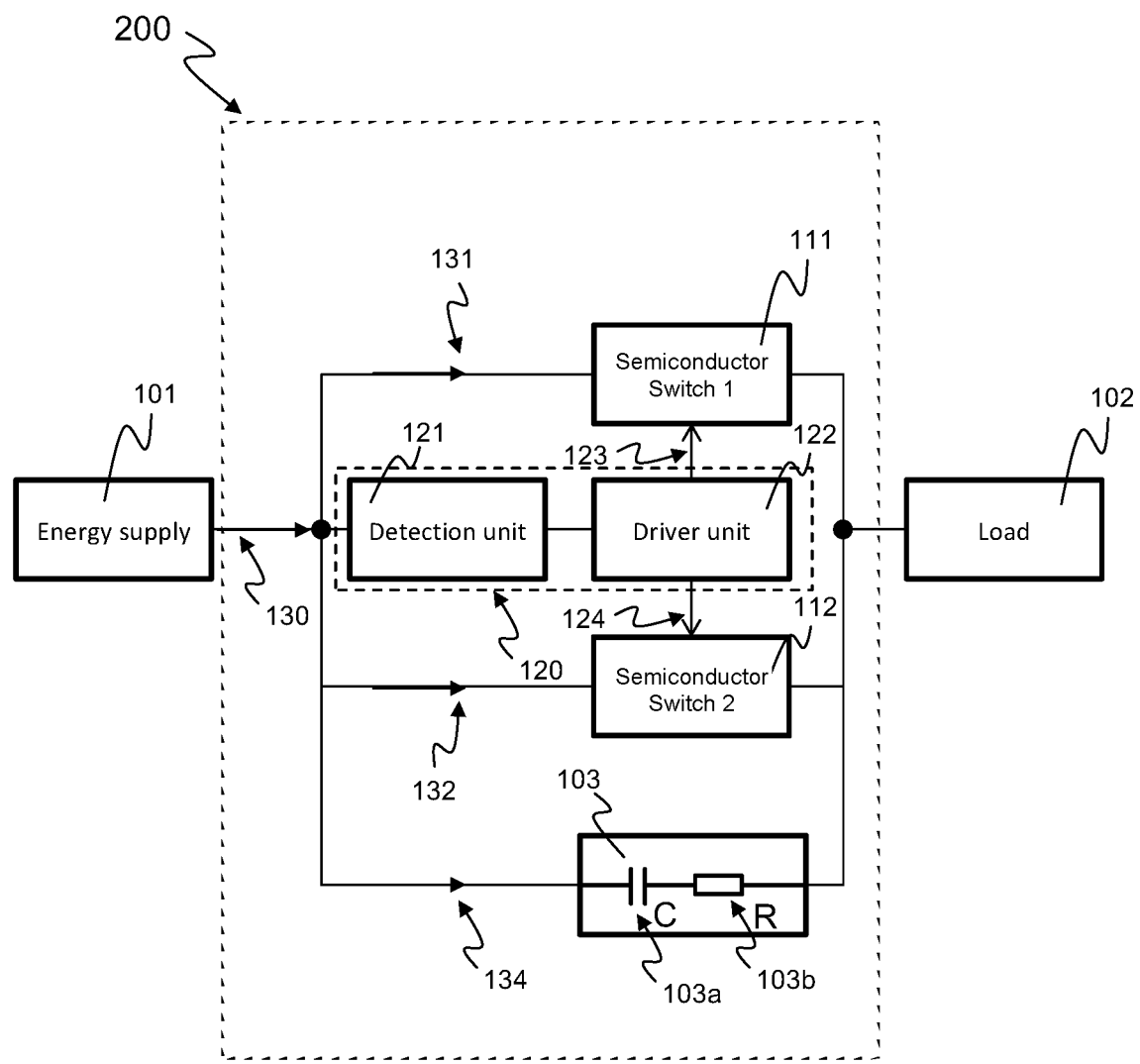
FIG. 2 shows a block diagram of an electronic circuit according to a second form of the present disclosure.

The RC snubber circuit can be implemented as a series circuit or a parallel circuit of a capacitor with a resistor, as shown, for example, in FIG. 2. In an RCD snubber circuit, a diode is also interconnected. These components are dimensioned suitably for the voltage and the current. The diode can be connected in series or in parallel. The diode can be connected, for example, in parallel with the resistor, and the capacitor can be connected in series with the diode/resistor parallel path. A second resistor can also be present in series with the diode. For example, the second resistor can then be connected in parallel with this "diode+resistor" circuit. The capacitor can then, for example, be connected in parallel with these three components. The snubber circuit can be installed in parallel with the semiconductor switches 111, 112.

As shown in FIG. 1, the control unit 120 comprises a driver circuit 122 or driver unit that is configured to control, in the event of the reaching of the critical current, the two semiconductor switches 111, 112 via a respective driver signal 123, 124 for the switching-off.

The control unit 120 can be configured to transmit, upon the achieving of the critical current, the respective driver signals 123, 124 simultaneously to the two semiconductor switches 111, 112 so that in the ideal case they are to be switched off simultaneously. However, the two semiconductor switches 111, 112 do not usually switch off at exactly the same time, since due to transit times and transient behaviors, a slight switching-off delay instead occurs of the first semiconductor switch 111 with respect to the second semiconductor switch 112.

The two semiconductor switches 111, 112 can be configured, for example, as SiC MOSFETs or as Si MOSFETs, and in one form as "normally-off" switches. Alternatively, insulated-gate bipolar transistors (IGBTs) can be provided, wherein with these components an additional interconnection can be used to provide "normally-off" behavior. The two semiconductor switches 111, 112 can be robust semiconductor switches that are avalanche-proof, i.e., wherein the semiconductor or MOSFET is configured such that it survives an avalanche breakdown or avalanche breakdown without impacting the semiconductor. The avalanche breakdown (avalanche) takes place due to the switching-off of an inductive circuit by a semiconductor. Due to the switching process of the semiconductor in the inductive circuit, an increased, local voltage results in the semiconductor. If this voltage lies above the permissible reverse voltage of the semiconductor, this leads to an avalanche breakdown in the semiconductor. Avalanche-proof semiconductors can survive this without impact.

The two semiconductor switches 111, 112 can furthermore be configured to reduce, after the switching-off, a circuit energy stored in the capacitors and in the inductances of the supply and the load.

As shown in FIG. 1, the control unit 120 can include a detection circuit 121 that can be configured to detect an overcurrent and/or a short-circuit current. The detection circuit 121 can be connected to the total current path 130 between energy supply 101 and load 102 in order to measure the current that flows over all semiconductor switches 111, 112, including the delay circuit 103.

Due to the parallel connection of the semiconductor switch 111, 112 and the delay circuit 103, the total current path 130 splits into the partial current paths 131, 132 with the respective semiconductor switches 111, 112, and into the partial current path 134 with the delay circuit 103. These partial current paths 131, 132, 134 combine again into the total current path 130, which then leads to the load 102.

The electronic circuit 100 is configured to carry the critical current, without an additional suppressor circuit, alone through the at least two semiconductor switches 111, 112 and the delay circuit 103, to separate them, and to reduce the circuit energies from the inductances and capacitances of the energy supply 101 and of the load 102.

FIG. 2 shows a block diagram of an electronic circuit 200 according to an exemplary second form.

The electronic circuit 200 according to the second form is configured identically to the above-described circuit 100 according to the first form, with the difference that the delay circuit 103 is configured here as an RC snubber circuit 103.

The RC snubber circuit is realized here as a series circuit of a capacitor 103a with a resistor 103b. These components are dimensioned suitably for the possibly occurring voltage and for the possibly occurring current. The snubber circuit 103 is connected in parallel with the semiconductor switches 111, 112.

During the separation of a critical current, for example, a short circuit or overcurrent, without the capacitor 103a, steep voltage peaks would arise because the change in speed of the current (for example, with an abruptly occurring short circuit) is high. These voltage peaks are intercepted by the RC snubber circuit 103 and damped by the current-change speed being reduced.

The critical current first flows at the original level into the capacitor 103a, and then drops with increasing charge of the capacitor 103a in accordance with the decreasing magnetic energy. Electrical energy that would otherwise lead to a resonance oscillation is simultaneously converted into heat by the current flow in the resistor 103b. The voltage-increase speed at the semiconductor switches 111, 112 is thereby limited to a value that is not critical for them.

With MOSFETs as semiconductor switches 111, 112, with this RC snubber circuit 103 it can also be inhibited that the Miller capacitance leads to unsound switching-off behavior with a too-rapid voltage increase.

Figure 3:
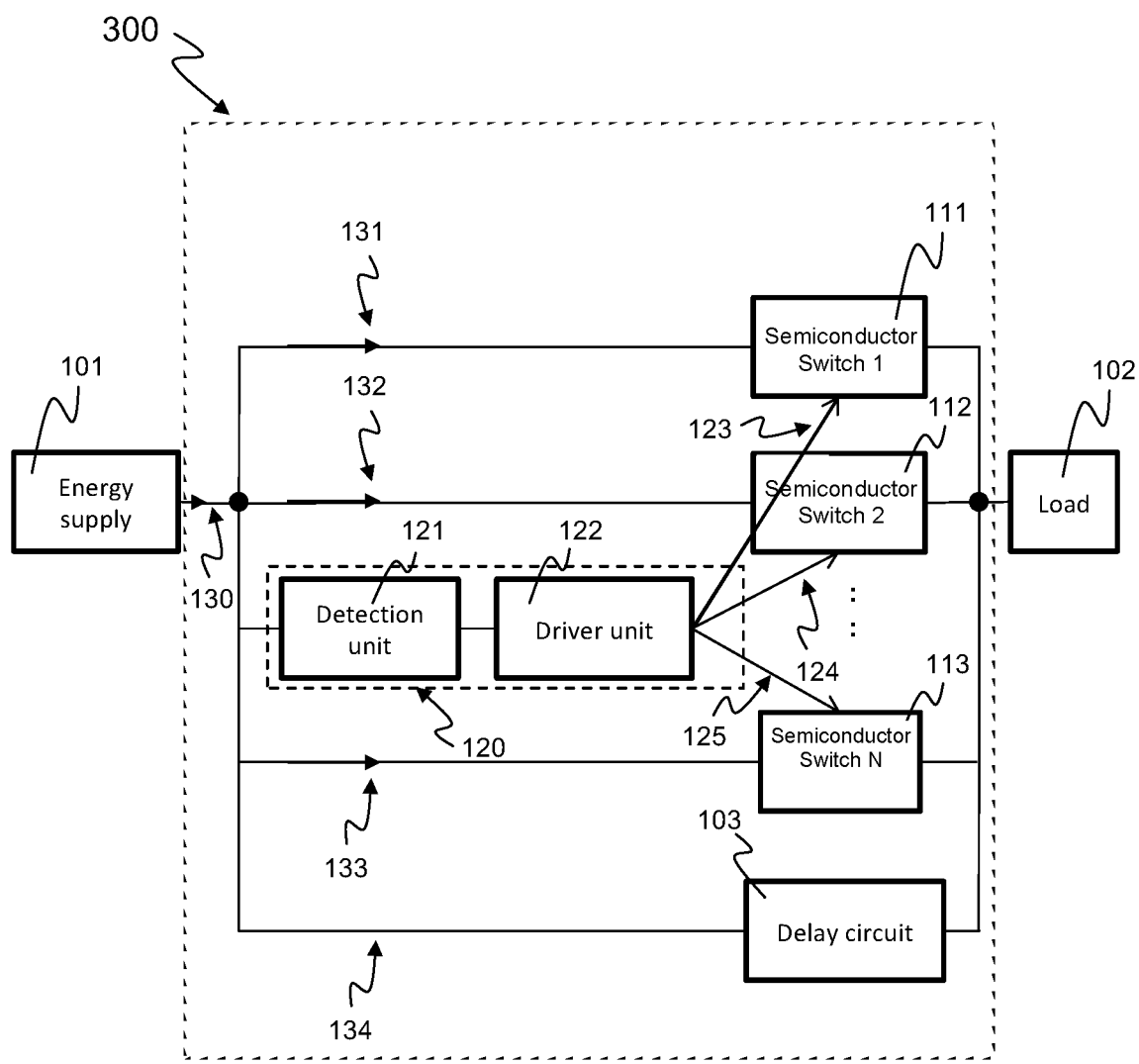
FIG. 3 shows a block diagram of an electronic circuit according to a third form of the present disclosure.

FIG. 3 shows a block circuit diagram of an electronic circuit 300 according to an exemplary third form.

The electronic circuit 300 according to the third form is configured identically to the above-described circuit 100 according to the first form, with the difference that here a variety of semiconductor switches 111, 112, 113 connected in parallel are used in order to switch off a critical current between energy supply 101 and load 102.

The electronic circuit 300 is for a battery-electric vehicle for the switching-off of semiconductor switches 111, 112, 113 in the event of critical currents.

The electronic circuit 300 comprises at least two semiconductor switches 111, 112, 113 that are connectable to one another in parallel between an energy supply source 101 and a load 102.

The electronic circuit 300 comprises a control unit 120, which is configured to detect a current flowing through the at least two semiconductor switches 111, 112, 113, and in the event of reaching of a critical current, to switch off the at least two semiconductors 111, 112, 113.

The electronic circuit 300 comprises a delay circuit 103, which is connected in parallel with the at least two semiconductor switches 111, 112, 113, and is configured to absorb, in the event of a not-exactly-simultaneous switching-off of the at least two semiconductor switches 111, 112, 113, a part of the critical current that switches over from at least one first-switching-off semiconductor switch 111 to the other semiconductor switch 112, 113 of the least two semiconductor switches 111, 112, 113.

Due to the parallel switching of the semiconductor switches 111, 112, 113 and the delay circuit 103, the total current path 130 splits into the partial current paths 131, 132, 133 with the respective semiconductor switches 111, 112, 113 and into the partial current path 134 with the delay circuit 103. These partial current paths 131, 132, 133, 134 combine again into the total current path 130, which then leads to the load 102.

The not-first-switching-off semiconductor switches 112, 113 can be configured to absorb the remaining part of the critical current that is not absorbed by the delay circuit 103.

The delay circuit 103 can be configured to absorb the part of the critical current at least until a last switching-off semiconductor switch 112 of the at least two semiconductor switches 111, 112, 113 is switched off.

The electronic circuit 300 can be configured to divide, from a switching-off of the at least one first-switching-off semiconductor switch 111 to a switching-off of a last switching-off semiconductor switch 112, the critical current between the not-yet-switched-off semiconductor switches 113 and the delay circuit 103.

The delay circuit 103 can include an energy storage for the receiving of energy of the part of the critical current.

The delay circuit 103 can comprise an RC snubber circuit, as represented above for FIG. 2, or an RCD snubber circuit.

The control unit 120 can include a driver circuit 122 that is configured to control, upon the reaching of the critical current, the at least two semiconductor switches 111, 112, 113 via a respective driver signal 123, 124, 125 for switching off. The control unit 120 can be further configured to transmit, upon the reaching of the critical current, the respective driver signal 123, 124, 125 simultaneously to the at least two semiconductor switches 111, 112, 113.

The at least two semiconductor switches 111, 112, 113 can be configured, for example, as SiC MOSFETs or as Si MOSFETs.

The at least two semiconductor switches 111, 112, 113 can be configured to reduce an energy stored in the capacitors and inductances of the energy supply 101 and of the load 102.

As shown in FIG. 3, the control unit 120 can include a detection circuit 121 that is configured to detect an overcurrent and/or a short circuit.

The electronic circuit 300 is configured to reduce the critical voltage, without an additional suppressor circuit, solely by the at least two semiconductor switches 111, 112, 113 and the delay circuit 103.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice, material, manufacturing, and assembly tolerances, and testing capability.

As used herein, the phrase at least one of A, B, and C should be construed to mean a logical (A OR B OR C), using a non-exclusive logical OR, and should not be construed to mean "at least one of A, at least one of B, and at least one of C."

In this application, the term "controller" and/or "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components (e.g., op amp circuit integrator as part of the heat flux data module) that provide the described functionality; or a combination of some or all of the above, such as in a system-on-chip.

The term memory is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general-purpose computer to execute one or more particular functions embodied in computer programs. The functional blocks, flowchart components, and other elements described above serve as software specifications, which can be translated into the computer programs by the routine work of a skilled technician or programmer.

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. An electronic circuit for a battery-electric vehicle for a switching-off of semiconductor switches in an event of critical currents, the electronic circuit comprising:
   at least two semiconductor switches that are coupled in parallel with one another between an energy supply source and a load;
   a control unit that is configured to detect a current flowing through the at least two semiconductor switches, and, based on a reaching of a critical current, to switch off the at least two semiconductor switches; and
   a delay circuit that is connected in parallel with the at least two semiconductor switches and is configured to absorb, in the event of a not-exactly-simultaneous switching-off of the at least two semiconductor switches, a part of the critical current that switches over from at least one first-switching-off semiconductor switch to another one of the at least two semiconductor switches.

2. The electronic circuit according to claim 1, wherein a not-first-switching-off semiconductor switch of the at least two semiconductor switches is configured to absorb a remaining part of the critical current that is not absorbed by the delay circuit.

3. The electronic circuit according to claim 1, wherein the delay circuit is configured to absorb the part of the critical current at least until a last switching-off semiconductor switch of the at least two semiconductor switches is switched off.

4. The electronic circuit according to claim 3, wherein the electronic circuit is configured to split, from a switching-off of the at least one first-switching-off semiconductor switch to a switching off of the last switching-off semiconductor switch, the critical current between a remainder of the at least two semiconductor switches and the delay circuit.

5. The electronic circuit according to claim 1, wherein the delay circuit includes an energy storage for an absorbing of an energy of the part of the critical current.

6. The electronic circuit according to claim 1, wherein the delay circuit comprises a resistor-capacitor snubber circuit.

7. The electronic circuit according to claim 1, wherein the delay circuit comprises a resistor-capacitor-diode snubber circuit.

8. The electronic circuit according to claim 1,
   wherein the control unit includes a driver circuit that is configured to control, based on reaching of the critical current, the at least two semiconductor switches via a respective driver signal for the switching-off; and wherein the control unit is configured to transmit, based on the reaching of the critical current, the respective driver signal simultaneously to the at least two semiconductor switches.

9. The electronic circuit according claim 1, wherein the at least two semiconductor switches are configured as SiC MOSFETs.

10. The electronic circuit according claim 1, wherein the at least two semiconductor switches are configured as Si MOSFETs.

11. The electronic circuit according to claim 1, wherein the control unit includes a detection circuit that is configured to detect an overcurrent.

12. The electronic circuit according to claim 1, wherein the control unit includes a detection circuit that is configured to detect a short-circuit current.

13. The electronic circuit according to claim 1, wherein the electronic circuit is configured to reduce the critical current, without an additional suppressor circuit, by the at least two semiconductor switches and the delay circuit.

* * * * *